United States Patent
Ikeno et al.

(10) Patent No.: US 7,369,237 B2
(45) Date of Patent: May 6, 2008

(54) SUBSTRATE PROCESSING APPARATUS AND SUBSTRATE PROCESSING SYSTEM

(75) Inventors: Yasunori Ikeno, Cupertino, CA (US);
Shunsuke Kurata, Kamiina-gun (JP);
Katsuyuki Hashimoto, Tokyo (JP);
Masahiko Yazawa, Tokyo (JP)

(73) Assignee: Olympus Corporation, Tokyo (JP)

( * ) Notice: Subject to any disclaimer, the term of this patent is extended or adjusted under 35 U.S.C. 154(b) by 416 days.

(21) Appl. No.: 11/120,296

(22) Filed: May 2, 2005

(65) Prior Publication Data
US 2006/0008134 A1    Jan. 12, 2006

(30) Foreign Application Priority Data
May 11, 2004    (JP) .................... P 2004-141415

(51) Int. Cl.
*G01B 11/00*    (2006.01)
(52) U.S. Cl. .................. 356/399; 356/400; 382/140; 382/142; 382/145
(58) Field of Classification Search ........ 356/399–400; 382/140–145
See application file for complete search history.

(56) References Cited

U.S. PATENT DOCUMENTS

| | | | |
|---|---|---|---|
| 4,644,172 A * | 2/1987 | Sandland et al. ........... | 356/400 |
| 5,488,292 A | 1/1996 | Tsuta | |
| 6,082,950 A * | 7/2000 | Altwood et al. ............ | 414/217 |
| 6,559,070 B1 * | 5/2003 | Mandal ...................... | 438/781 |
| 6,963,394 B2 * | 11/2005 | Yamamoto et al. ...... | 356/237.4 |

FOREIGN PATENT DOCUMENTS

| | | |
|---|---|---|
| JP | 9-162257 A | 6/1997 |
| JP | 11-121579 A | 4/1999 |
| JP | 2000-077490 A | 3/2000 |

* cited by examiner

Primary Examiner—Layla G. Lauchman
Assistant Examiner—Iyabo S Alli
(74) Attorney, Agent, or Firm—Frishauf, Holtz, Goodman & Chick, P.C.

(57) ABSTRACT

It is an object of the present invention to provide a substrate processing apparatus, comprising a housing body mounting unit that is capable of mounting a plurality of housing bodies which can house a plurality of substrates, a processing apparatus main body for processing a substrate extracted from the housing body, a transportation unit for transporting the substrate between the housing body and the processing apparatus main body, a processing control unit for controlling the transportation unit and making it transport the substrate between the housing body and the processing apparatus main body, and a transportation control unit for controlling the transportation unit and making it transport the substrate from one housing body to another housing body without passing through the processing apparatus main body.

16 Claims, 6 Drawing Sheets

SUBSTRATE PROCESSING APPARATUS AND SUBSTRATE PROCESSING SYSTEM

BACKGROUND OF THE INVENTION

1. Field of the Invention

The present invention relates to a substrate processing apparatus, such as a substrate inspection apparatus, a substrate manufacturing apparatus or the like, and a substrate processing system provided with the same.

Priority is claimed on Japanese Patent Application No. 2004-141415, filed May 11, 2004, the content of which is incorporated herein by reference.

2. Description of Related Art

In a plant where semiconductor wafers are manufactured, the semiconductor wafers are generally transported by cassettes that are capable of housing a plurality of semiconductor wafers between substrate processing apparatuses, such as a substrate manufacturing apparatus for manufacturing the semiconductor wafers and a substrate inspection apparatus for inspecting the semiconductor wafers. Meanwhile, in semiconductor manufacturing processes, there is a process for the semiconductor wafer to be extracted from the cassette to be transported to another cassette. That is, when the semiconductor wafer is subjected to, for example, wet heat processing, there is a case in which the wafer is transported from a cassette for general purpose use to a cassette having chemical resistance and thermal resistance as a prepreparation for those processes.

A dedicated transportation apparatus is conventionally used for substrate transportation between cassettes (refer to, for example, Japanese Unexamined Patent Application, First Publication No. H09-162257).

SUMMARY OF THE INVENTION

A substrate processing apparatus according to the present invention provides a housing body mounting unit that is capable of mounting a plurality of housing bodies which can house a plurality of substrates, a processing apparatus main body for processing the substrates extracted from the housing body, a transportation unit for transporting the substrates between the housing body and the processing apparatus main body, a processing control unit for controlling the transportation unit and making the transportation unit transport the substrates between the housing body and the processing apparatus main body, and a transportation control unit for controlling the transportation unit and making the transportation unit transport the substrates from one housing body to another housing body without passing through the processing apparatus main body.

The housing body mounting unit may mount at least three housing bodies that are capable of delivering the substrates to and from the transportation unit.

The substrate processing apparatus according to the present invention may be provided with a data input unit for inputting a transportation condition for transporting the substrates from one housing body to another housing body, wherein the data input unit is electrically connected to the transportation control unit.

The substrate processing apparatus according to the present invention may be provided with a substrate ID reading unit for reading identification information of the substrates housed in one housing body, wherein the transportation control unit transports the substrates from one housing body to another housing body based on the identification information.

The processing apparatus main body may include an inspection unit composed of a macro inspection unit and a micro inspection unit.

The substrate processing apparatus according to the present invention may be provided with a rotating transfer unit for transferring the substrates between the macro inspection unit and the micro inspection unit.

The macro inspection unit may be provided with a mounting table for swinging and rotating the substrates, and an arm for performing macro inspection of a backside of the substrates.

A substrate ID reading unit may be provided at a substrate loading position.

A notch of the substrates may be detected by the substrate ID reading unit provided at the substrate loading position.

When transporting the substrates from one housing body to the other housing body without passing them through the processing apparatus main body by controlling the transportation unit, the substrates may be transported to the other housing body after performing alignment at the substrate loading position.

Whether a notch orientation of the substrates is oriented or not may be selectable, and if it is oriented, the notch orientation may be specified.

An alignment module for substrate alignment may be provided at the substrate loading position, wherein the alignment module includes a plurality of position detecting sensors, and a rotation holding unit having a rolling mechanism which mounts and rotates the substrates.

When the substrates are arranged at the substrate loading position, an edge position of the substrates may be detected by the plurality of position detecting sensors, the transportation unit may be operated based on this detected result, and thereby a centering deviation of the substrates with respect to the rotation holding unit of the alignment module may be corrected.

An alignment module for alignment composed of a taper pin that is contacted to the edge of the substrates to find out a center position thereof may be provided at the substrate loading position.

Moreover, a substrate processing system according to the present invention provides a substrate processing apparatus having the constitution mentioned above, and a host computer for outputting data of the transportation conditions for transporting the substrates from one housing body to another housing body, to the transportation control unit.

The substrate processing system according to the present invention may be provided with a communication unit that can achieve communication between a control unit of the substrate processing apparatus and a host computer.

DETAILED DESCRIPTION OF THE INVENTION

Figure 1:
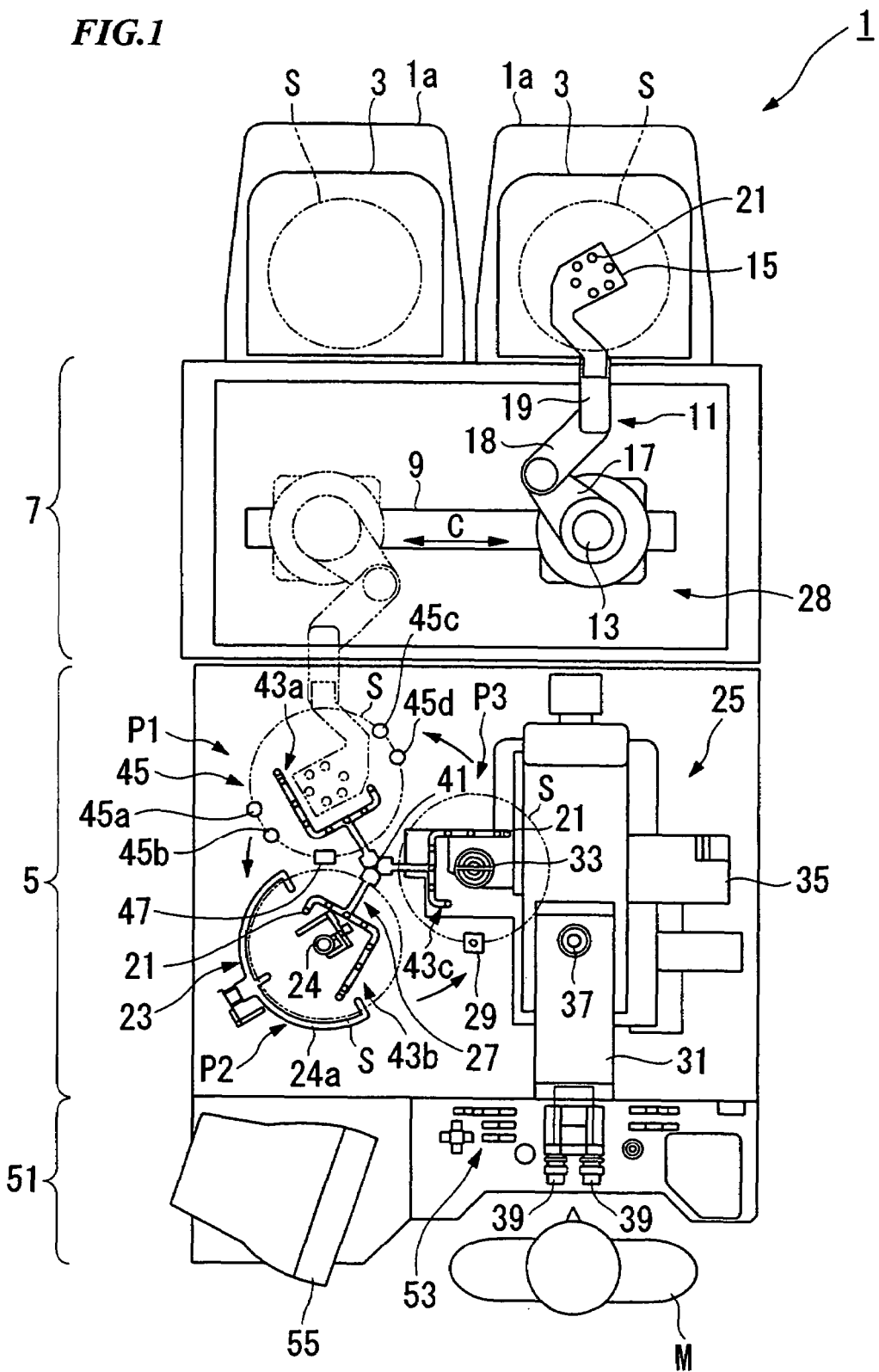
FIG. 1 is an outline plan view showing a substrate inspection apparatus according to an embodiment of the present invention.

Hereafter, referring to the drawings, embodiments of the present invention will be explained in detail with reference to FIG. 1 through FIG. 3.

As shown in FIG. 1, a substrate inspection apparatus (substrate processing apparatus) 1 of the present invention inspects for defects on a frontside and a backside of a semiconductor wafer (substrate) S in which a device pattern is formed. Two wafer cassettes (housing bodies) 3 are adjacently arranged in this substrate inspection apparatus 1, and a plurality of semiconductor wafers S are housed in this wafer cassette 3 vertically at a predetermined pitch. This substrate inspection apparatus 1 provides an inspection unit 5 for inspecting the semiconductor wafer S, and a loader (transportation) unit 7 for transporting the semiconductor wafer S between the wafer cassette 3 and the inspection unit 5.

The loader unit 7 provides two wafer cassette mounting units (housing body mounting units) 1a for attachably and detachably mounting the wafer cassette 3, and a shift mechanism 9 and a wafer transfer robot 11 for transporting the semiconductor wafer S. Each of the wafer cassette mounting units 1a can mount one wafer cassette 3. As can be seen from the drawing, this loader unit 7 is constituted so that two wafer cassettes 3 may be attachably and detachably mounted.

The shift mechanism 9 reciprocatingly shifts the wafer transfer robot 11 in one axis (C-axis) between a position where the semiconductor wafer S is delivered to and from each wafer cassette 3, and a position where the semiconductor wafer S is delivered to and from the inspection unit 5.

The wafer transfer robot 11 is an articulated robot including an axis of rotation 13 which is movably mounted on the shift mechanism 9 in the C-axis, a plate-like mounting plate 15 for mounting the semiconductor wafer S, and three link arms 17 through 19 for mutually linking the axis of rotation 13 and the mounting plate 15.

That is, one end of a first link arm 17 is rotationally linked to the axis of rotation 13, and the other end of the first link arm 17 is rotationally linked to one end of a second link arm 18. The other end of the second link arm 18 is rotationally linked to one end of a third link arm 19, and the mounting plate 15 is fixed to the other end of the third link arm 19. Accordingly, by suitably rotating these three link arms 17 through 19, a distance between the axis of rotation 13 and the mounting plate 15 is changed. In other words, telescopic motion of the wafer transfer robot 11 is performed.

A plurality of suction holes 21 are formed in a surface of the mounting plate 15, and these suction holes 21 are communicated with a suction pump that is not shown. That is, when operating the suction pump in a state where the semiconductor wafer S is mounted on the surface of the mounting plate 15, the semiconductor wafer S will be held onto the mounting plate 15 by a suction force of the suction pump.

Since the loader unit 7 is constituted as described above, the mounting plate 15 can move the semiconductor wafer S from one wafer cassette 3 to another wafer cassette 3, and from each wafer cassette 3 to the wafer loading position P1 in the inspection unit 5. The wafer loading position P1 indicates a position where the semiconductor wafer S is delivered between the wafer transfer robot 11 and the inspection unit 5.

The inspection unit 5 provides a well-known macro inspection unit (processing apparatus main body) 23 and micro inspection unit (processing apparatus main body) 25, and a rotating transfer unit 27 for transferring the semiconductor wafer S among the wafer loading position P1, the macro inspection unit 23, and the micro inspection unit 25 of the inspection unit 5.

The macro inspection unit 23 provides a mounting table 24 for swinging and rotating the semiconductor wafer S during the macro inspection, and an arm 24a for turning and shifting the semiconductor wafer S for the backside thereof to be seen in order to perform the macro inspection of the backside.

The micro inspection unit 25 provides a position detecting sensor 29 for alignment provided at a wafer delivery position P3 to the rotating transfer unit 27, a microscope 31 for enlarging an image of the semiconductor wafer S, a wafer holding unit 33 which mounts the semiconductor wafer S and has a rolling mechanism, and an X-Y stage 35 for shifting the wafer holding unit 33 between the wafer delivery position P3 and a predetermined observation position of the microscope 31.

The position detecting sensor 29, which is composed of, for example, a CCD camera, detects an edge position of the semiconductor wafer S from the image after the semiconductor wafer S is delivered to the wafer holding unit 33 from the rotating transfer unit 27 at the wafer delivery position P3 of the rotating transfer unit 27.

This detected result is used for a correction of a centering deviation and an angle deviation of the semiconductor wafer S with respect to a normal position of the semiconductor wafer S in the wafer holding unit 33.

In this micro inspection unit 25, the image of the semiconductor wafer S enlarged by the microscope 31 can be picked up by an image pick-up device 37, such as a CCD camera or the like, or can be observed through an ocular lens 39.

The rotating transfer unit 27 rotates about an axis of rotation 41 (counterclockwise direction in the example shown in FIG. 1), and provides three rotating arms 43a through 43c extending from the axis of rotation 41 orthogonally thereto.

These three rotating arms 43a through 43c are arranged at an equal angle (for example, every 120 degrees) around the axis of rotation 41. In addition, these three rotating arms 43a through 43c are arranged at any of the wafer loading position P1 where the wafer delivery to the wafer transfer robot 11 is performed, the macro inspection position P2 where the macro inspection is performed by the macro inspection unit 23, and the wafer delivery position P3 where the wafer delivery to the micro inspection unit 25 is performed, respectively.

An approximately L-shaped mounting unit for mounting the semiconductor wafer S is provided at the tip of each of the rotating arms 43a through 43c. A plurality of suction holes 21 are formed in the surface of each mounting unit, and these suction holes 21 are communicated with the suction pump (not shown). That is, when operating the suction pump in a state where the semiconductor wafer S is mounted on the surface of the mounting unit, the semiconductor wafer S will be held onto the mounting unit by the suction force of the suction pump.

The transportation unit 28 for transporting the semiconductor wafer S is composed of this rotating transfer unit 27, and the shift mechanism 9 and the wafer transfer robot 11 of the loader unit 7.

An alignment module 45 for alignment and a wafer ID reading module (substrate ID reading unit) 47 for the semiconductor wafer S are provided at the wafer loading position P1.

The alignment module 45 provides a plurality of position detecting sensors 45a through 45d (four in the example shown in FIG. 1), and a rotation holding unit (not shown) having a rolling mechanism which mounts and rotates the semiconductor wafer S. Each of the position detecting sensors 45a through 45d is composed of, for example, a CCD camera, and is arranged on a single circle having the same size as the semiconductor wafer S. Meanwhile, two position detecting sensors, which are adjacent to each other among position detecting sensors 45a through 45d, are arranged in a relationship in which they are space apart by more than a length of an orientation flat of the semiconductor wafer S. When delivering the semiconductor wafer S to the rotating arms 43a through 43c from the wafer transfer robot 11, these position detecting sensors 45a through 45d detect the edge position of the semiconductor wafer S as the image.

This detected result is used for an alignment correction of the centering deviation or the angular deviation of the semiconductor wafer S with respect to the normal position of the semiconductor wafer S in the mounting unit of the rotating transfer unit 27, and the mounting plate 15 of the wafer transfer robot 11.

The wafer ID reading module 47 reads a wafer ID (identification information) written on the edge portion of the semiconductor wafer S, and is provided with an image pick-up unit, such as a CCD camera, which picks up the image of the edge portion. That is, at the wafer loading position P1, the image of the edge portion of the semiconductor wafer S which is being rotated at a constant rotational speed by the rotation holding unit is picked up by the image pick-up unit, so that the image including the wafer ID can be captured.

In addition, the above-mentioned wafer ID is used for identifying a form of the semiconductor wafer S (type, size, lot or the like) and contents of various kinds of processing, such as a manufacturing process, an inspection process, or the like of the semiconductor wafer S, and determining whether respective processing is required or not.

Figure 2:
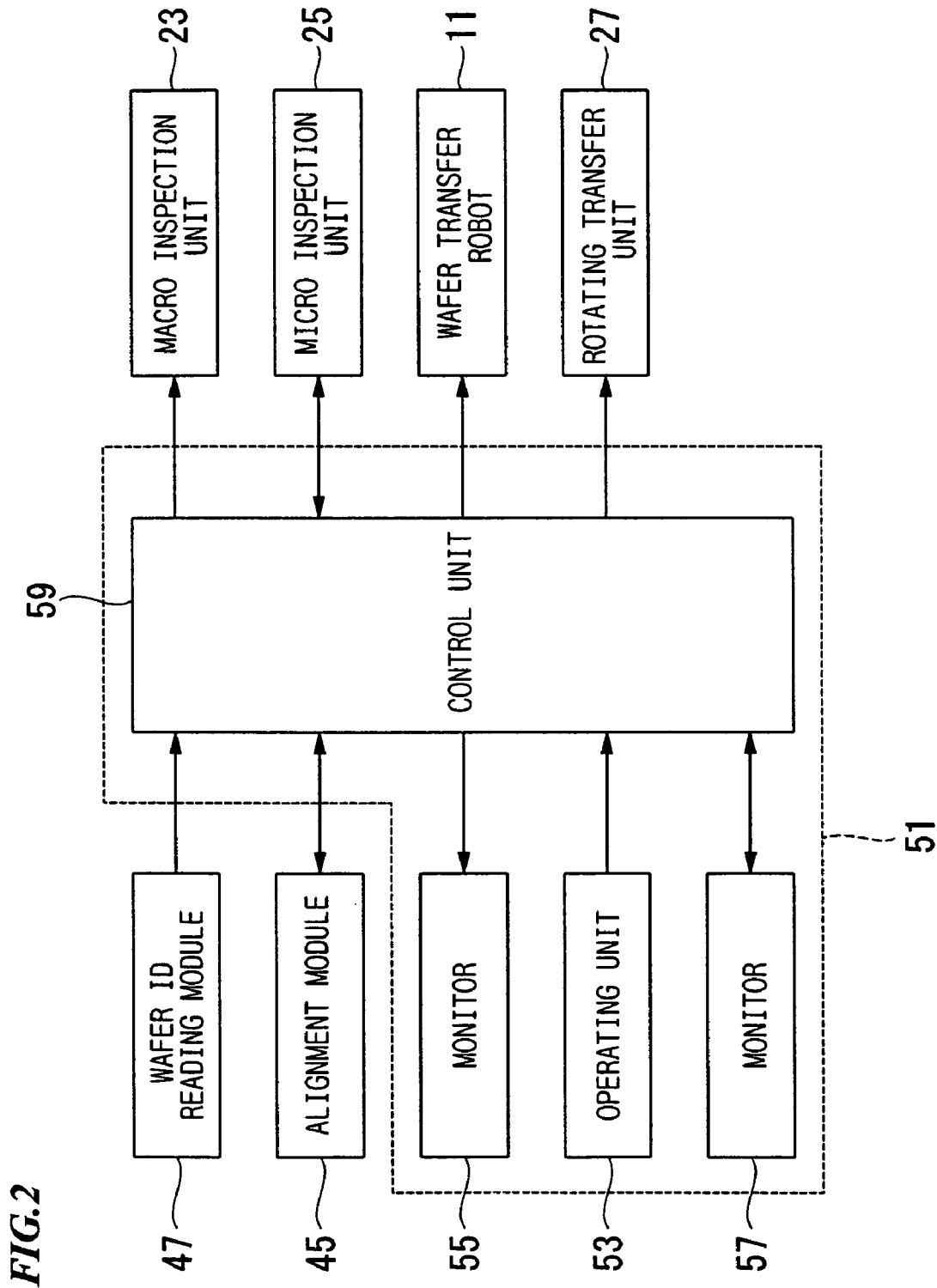
FIG. 2 is a block diagram showing an outline constitution of the substrate inspection apparatus of FIG. 1.

A control unit 51 is adjacently provided to this inspection unit 5, and this control unit 51 includes an operating unit (data input unit) 53, a monitor 55, a memory unit 57, and a control unit 59 as shown in FIG. 1 and FIG. 2. The monitor 55 displays various types of information concerning the semiconductor wafer S.

The operating unit 53 is provided for an inspector M to perform various kinds of operations, such as operations of the wafer transfer robot 11 and the rotating transfer unit 27, and the macro inspection and the micro inspection in the inspection unit 5. This operating unit 53 is provided with a keyboard for the operator of the inspection apparatus 1 to input various types of information, and a mouse for the operator to click an arbitrary position on the screen of the monitor 55, and input various types of information (neither is shown).

The memory unit 57 stores the information concerning the semiconductor wafer S, and various kinds of programs for performing various kinds of operations in the inspection unit 5 and the loader unit 7. This memory unit 57 stores an inspection program for performing inspection processing of the semiconductor wafer S by making the wafer transfer robot 11 and the rotating transfer unit 27 transfer the semiconductor wafer S between the wafer cassette 3, and the macro inspection unit and the micro inspection unit; and a transportation program for transporting the semiconductor wafer S from one wafer cassette 3 to another wafer cassette 3 using the wafer transfer robot 11.

In addition, when the transportation program is used, the semiconductor wafer S will be transported without passing through the macro inspection unit and the micro inspection unit. That is, according to this transportation program, the semiconductor wafer S extracted from the wafer cassette 3 is directly transported to another wafer cassette 3. Alternatively, the semiconductor wafer S is transported to another wafer cassette 3 after alignment is performed for the semiconductor wafer S by the alignment module 45 at the wafer loading position P1.

Figure 3:
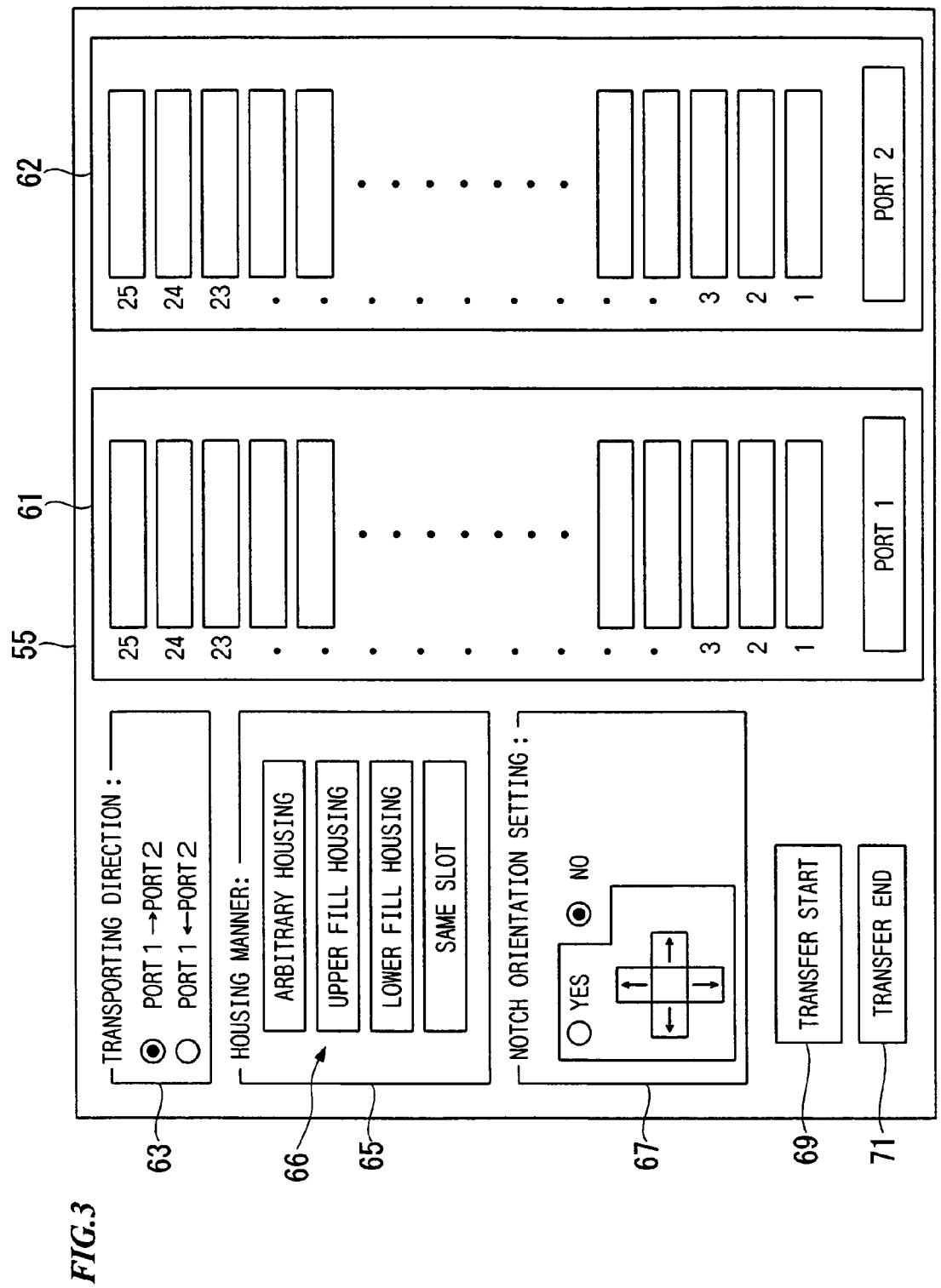
FIG. 3 is a view showing an example of a screen displayed on a monitor in the substrate inspection apparatus of FIG. 1.

When the above-mentioned transportation program is activated based on the operation of the operating unit 53, slot map information screens 61 and 62 for displaying the wafer ID of the semiconductor wafer S corresponding to a slot number (1st through 25th in the example in FIG. 3) which shows a housing position of the semiconductor wafer S in two wafer cassettes 3 is displayed on the monitor 55 as shown in FIG. 3. There is also displayed on these slot map information screens 61 and 62 information indicating the presence of the semiconductor wafer S in each slot in a state where each wafer cassette 3 is mounted. In addition, "port 1" and "port 2" in the drawing show mounting positions of wafer cassettes 3, respectively.

Also, a transporting direction selection screen 63 for setting a transportation condition of the semiconductor wafer S, a housing manner selection screen 65, a notch orientation setting screen 67, a transportation start button 69, and a transportation end button 71 are displayed on the monitor 55.

On the transporting direction selection screen 63, the wafer cassette 3 from which the semiconductor wafer S is extracted and the wafer cassette 3 in which the semiconductor wafer S is housed can be selected.

That is, for example, when "port 1→port 2" on the screen is clicked using the mouse of the operating unit 53, the semiconductor wafer S is transported from the wafer cassette 3 mounted in "port 1" to the wafer cassette 3 mounted in "port 2."

A plurality of housing selection buttons 66 for indicating the housing manner are displayed on the housing manner selection screen 65, and by clicking the housing selection button 66 using the mouse of the operating unit 53, the semiconductor wafer S can be transported according to the housing manner corresponding to each housing selection button 66.

The housing selection button 66 includes an "arbitrary housing" button for selecting a slot number in the wafer cassette 3 of the transporting destination, in which the semiconductor wafer S is housed, from the operating unit 53, an "upper fill housing" button and a "lower fill housing" button for housing the semiconductor wafer S so as to be sequentially filled from a slot positioned in one end of the wafer cassette 3 of the transporting destination, and a "same slot" button for housing the semiconductor wafer S in the same slot number as that of the wafer cassette 3 of the transporting origin.

On the notch orientation setting screen 67, it is selected whether the notch orientation of the semiconductor wafer S in the wafer cassette 3 of the transporting destination is to be oriented, and if it is to be oriented, the notch orientation may be specified.

That is, for example, when a "YES" button on the screen is clicked using the mouse of the operating unit 53, the semiconductor wafer S extracted from the wafer cassette 3 of transporting origin is arranged at the wafer loading position P1, and alignment is performed by the alignment module 45, so that a notch position is detected using the image pick-up unit of the wafer ID reading module 47. Here, a relationship between an angle of the semiconductor wafer S relative to the mounting plate 15 when the wafer transfer robot 11 receives the semiconductor wafer S from the wafer cassette 3, and an angle of the semiconductor wafer S relative to the rotation holding unit at the wafer loading position P1 when the wafer transfer robot 11 delivers the semiconductor wafer S at the wafer loading position P1 is associated. Therefore, when the notch is detected by the wafer ID reading module 47, the notch orientation when delivering the semiconductor wafer S to the wafer cassette 3 can be determined by detecting how many degrees it is rotated. Thereby, the semiconductor wafer S is transported to the wafer cassette 3 of the transporting destination in a state where the notch orientation is oriented. In addition, in this case, the notch orientation of the semiconductor wafer S can be specified by clicking the orientation selection button.

Meanwhile, when a "NO" button is clicked, the semiconductor wafer S will be transported to the wafer cassette 3 of the transporting destination from the wafer cassette 3 of the transporting origin without passing through the wafer loading position P1.

The click operation of the transportation start button 69 can be operable with the mouse when the setting of the transportation condition of the semiconductor wafer S has been completed, and the transportation condition has been satisfied. When this transportation start button 69 is clicked, a motion control to the wafer transfer robot 11 or the like is performed by the control unit 59 based on a transportation condition being set, so that the semiconductor wafer S is transported.

The transportation end button 71 terminates a transportation program in response to its click operation.

The control unit 59 is constituted so as to display various kinds of captured images on the monitor 55, while suitably controlling various kinds of operations of the macro inspection unit 23, the micro inspection unit 25, the wafer transfer robot 11, the rotating transfer unit 27, or the like according to the operation of the operating unit 53 and various kinds of programs stored in the memory unit 57.

Moreover, the control unit 59 is constituted so as to extract and read the wafer ID as identification data from the enlarged image that is picked up by the image pick-up unit of the wafer ID reading module 47. That is, for example, when the wafer ID written on the semiconductor wafer S is a character, such as an alphabetical character, a numeric character, or the like, image processing is suitably performed on the enlarged image captured by the control unit 59, so that the wafer ID is recognized as character data. In addition, the identification data of the wafer ID that has been read is associated with each slot of the wafer cassette 3 for housing the semiconductor wafer S and is stored in the memory unit 57.

The substrate ID reading unit, which reads the wafer ID of the semiconductor wafer S, is composed of this control unit 59, the wafer ID reading module 47, and the rotation holding unit of the alignment module 45.

Moreover, the inspection control unit (processing control unit), which controls the transportation unit 28 so as to make it transport the semiconductor wafer S between the wafer cassette 3, and the macro inspection unit 23 and the micro inspection unit 25, is composed of the control unit 59, and the inspection program stored in the memory unit 57.

Furthermore, the transportation control unit, which controls the transportation unit 28 so as to make the wafer transfer robot 11 transport the semiconductor wafer S from the wafer cassette 3 to another wafer cassette 3 without passing through the macro inspection unit 23 and the micro inspection unit 25, is composed of the transportation program stored in the memory unit 57, and the control unit 59.

Next, operation of the substrate inspection apparatus 1 constituted as described above will be explained.

When performing defect inspection of the semiconductor wafer S, first, an inspector operates the operating unit 53 to activate the inspection program stored in the memory unit 57, and mounts the wafer cassette 3 which houses a non-inspected semiconductor wafer S, to the wafer cassette mounting unit 1a of the loader unit 7.

Next, the semiconductor wafer S is extracted from the inside of the wafer cassette 3 by the wafer transfer robot 11, and is transported to the wafer loading position P1 where the semiconductor wafer S is delivered to and from the mounting unit of the rotating transfer unit 27. The position detecting sensors 45a through 45d then detect the edge position of the semiconductor wafer S, and the wafer transfer robot 11 is shifted based on this detected result, so that the centering deviation of the semiconductor wafer S with respect to the mounting unit of the rotating transfer unit 27 is roughly corrected.

After this correction is completed, the semiconductor wafer S is delivered to the mounting unit of the rotating transfer unit 27 from the wafer transfer robot 11, and is moved by the rotation of the rotating transfer unit 27 from the wafer loading position P1 to the macro inspection position P2. The semiconductor wafer S is then delivered to the macro inspection unit 23 from the mounting unit, and macro inspection of the semiconductor wafer S is performed in the macro inspection unit 23. After this macro inspection is completed, the semiconductor wafer S is delivered to the mounting unit from the macro inspection unit 23, and is moved by the rotation of the rotating transfer unit 27 from the macro inspection position P2 to the wafer delivery position P3 of the micro inspection unit 25.

The semiconductor wafer S is then delivered to the wafer holding unit 33 of the micro inspection unit 25 from the mounting unit of the rotating transfer unit 27. Next, based on the detected result of the edge position of the semiconductor wafer S detected by the position detecting sensor 29 of the micro inspection unit 25, the control unit 59 shifts the wafer holding unit 33 using the X-Y stage 35, so that alignment processing for correcting the centering deviation and the angular deviation of the semiconductor wafer S with respect to the microscope 31 is performed.

The X-Y stage 35 is then translated along the surface of the semiconductor wafer S to enlarge the semiconductor wafer S through the microscope 31, and micro inspection, such as displaying the enlarged image on the monitor 55, observing the semiconductor wafer S through the ocular lens 39, or the like is performed.

After the micro inspection is completed, the semiconductor wafer S is delivered to the mounting unit of the rotating transfer unit 27 from the wafer holding unit 33 of the micro inspection unit 25, and is moved by the rotation of the rotating transfer unit 27 to the wafer loading position P1 from the wafer delivery position P3 to the micro inspection unit 25. The semiconductor wafer S is delivered to the mounting plate 15 of the wafer transfer robot 11 from the mounting unit. Finally, the mounting plate 15 is arranged at the loading position of the wafer cassette 3, and the semiconductor wafer S is housed in the wafer cassette 3.

Similarly, the above operations are sequentially performed for other semiconductor wafers S which have not been inspected and are housed in the wafer cassette 3.

Also, when the semiconductor wafer S is transported from one wafer cassette 3 to another wafer cassette 3, first, the inspector operates the operating unit 53 to activate the inspection program stored in the memory unit 57, and mounts on the loader unit 7 the wafer cassette 3 that houses the semiconductor wafer S and the wafer cassette 3 of the transporting destination.

In this case, the slot map information screens 61 and 62, the transporting direction selection screen 63, the housing manner selection screen 65, the notch orientation setting screen 67, the transportation start button 69, and the transportation soft end button 71 are displayed on the monitor 55 by the control unit 59. When the inspector M sets the transportation conditions of the semiconductor wafer S on these screens, and clicks the transportation start button 69, the semiconductor wafer S is transported based on the transportation conditions set. During this transportation, the wafer cassette 3 is fixed not to be detached from the loader unit 7.

Meanwhile, when the notch orientation is set on the notch orientation setting screen 67, the semiconductor wafer S is housed in the wafer cassette 3 of the transporting destination after passing through the wafer loading position P1.

That is, the control unit 59 controls the operation of the wafer transfer robot 11 to arrange the semiconductor wafer S at the wafer loading position P1. Next, the position detecting sensors 45a through 45d detect the edge position of the semiconductor wafer S, and the wafer transfer robot 11 is shifted based on this detected result, so that the centering deviation of the semiconductor wafer S with respect to the rotation holding unit of the alignment module 45 is roughly corrected.

After this correction is completed, the semiconductor wafer S is delivered to the rotation holding unit from the wafer transfer robot 11, and the notch position is detected using the image pick-up unit of the wafer reading module 47 while rotating the semiconductor wafer S using the rotation holding unit. Subsequently, based on the detected notch position, the semiconductor wafer S is further rotated by the rotation holding unit so as to have the same notch orientation as that of the wafer cassette 3 of the transporting destination specified on the notch orientation setting screen 67. Finally, the semiconductor wafer S is delivered to the wafer transfer robot 11 from the rotation holding unit, and housed in the wafer cassette 3 of the transporting destination.

When all semiconductor wafers S have been transported, there will be in a state where the wafer cassette 3 can be detached, so that the wafer cassette 3 is detached from the loader unit 7 by the inspector M, a transportation vehicle (not shown) that transports the wafer cassette 3, or the like.

As described above, according to this substrate inspection apparatus 1, since the semiconductor wafer S can be transported from one wafer cassette 3 to another wafer cassette 3 while the defect inspection of the semiconductor wafer S is not performed, it is not required to separately provide a device for transporting the semiconductor wafer S, thereby making it possible to achieve a cost reduction in a plant and equipment in the semiconductor manufacturing plant.

In addition, by inputting the transportation condition of the semiconductor wafer S into the operating unit 53, the semiconductor wafers S can be housed in the wafer cassette 3 of the transporting destination in a state where they are suitably arranged.

Further, when the semiconductor wafer S is housed in the wafer cassette 3 of the transporting destination with the notch orientation oriented using the alignment module 45 or the image pick-up unit of the wafer ID reading module 47, it makes it easier to handle the semiconductor wafer S in a different device.

In addition, in this embodiment, the position detecting sensors 45a through 45d constituting the alignment module 45 are composed of CCD cameras, but they may be composed of, for example, taper pins to be contacted with the edge of the semiconductor wafer S.

In addition, in this embodiment, the semiconductor wafer S is transported based on the transportation conditions that the inspector M inputs into the operating unit 53, but without being limited to this, the wafer ID of the semiconductor wafer S is read by a wafer ID reading unit, so that the semiconductor wafer S may be transported based on the wafer ID that the transportation control unit read.

According to this constitution, since the input of the transportation conditions by the inspector M can be omitted, the semiconductor wafer S can be transported in a short time. In this constitution, however, the transportation conditions corresponding to the wafer ID may be preferably stored in the memory unit 57 in advance.

Figure 4:
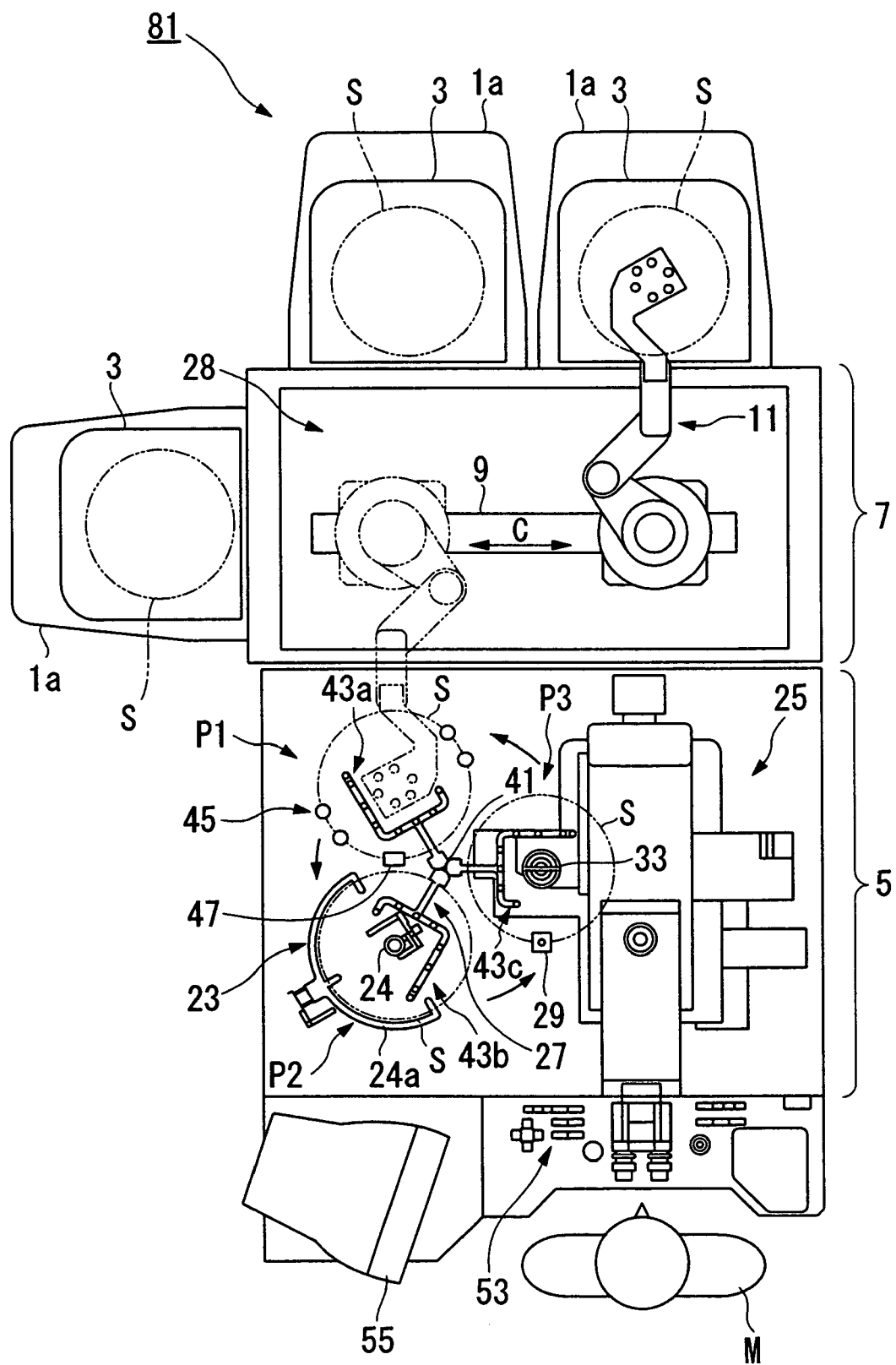
FIG. 4 is an outline plan view showing a substrate inspection apparatus according to another embodiment of the present invention.

Further, two wafer cassettes 3 can be mounted on the loader unit 7, but without being limited to this, what is necessary is that at least a plurality of wafer cassettes 3 can be mounted thereon. That is, as shown in, for example, FIG. 4, three wafer cassette mounting units 1a may be provided to the loader unit 7, so that a substrate inspection apparatus 81 having three wafer cassettes 3 mountable on the loader unit 7 may be constituted.

According to this constitution, one wafer cassette 3 which houses the non-inspected semiconductor wafer S is mounted on the loader unit 7, and two wafer cassettes 3 for transporting the semiconductor wafer S are mounted thereon. In addition, the inspection program and the transportation program are integrated into one program, and stored in the memory unit 57 as one control program for tying together the controls of the inspection processing with the transportation processing. Alternatively, it may be constituted such that the inspection program and the transportation program are made to be able to start at the same time, and a parallel processable control program is stored in the memory unit 57 while displaying both screens for the inspection processing and the transportation processing on the monitor 55. Thereby, transportation processing of the semiconductor wafer S can be performed, while performing defect inspection of the semiconductor wafer S.

That is, when the above-mentioned control program is activated to start inspection processing and transportation processing, after the semiconductor wafer S is extracted from the wafer cassette 3 for inspection to be transported to the wafer loading position P1 of the inspection unit 5, the wafer transfer robot 11 extracts the semiconductor wafer S to be transported to the wafer cassette 3 of the transporting destination from the wafer cassette 3 of the transporting origin. This transportation processing is repeatedly performed until a state, in which a semiconductor wafer S that is arranged at the wafer loading position P1 is moved to the macro inspection position P2 by the rotating transfer unit 27 and the semiconductor wafer S is not arranged at the wafer loading position P1, has attained.

Also, when the semiconductor wafer S, for which micro inspection has been completed, is moved to the wafer loading position P1 from the wafer delivery position P3, since it is necessary for this semiconductor wafer S to be returned to the wafer cassette 3 for inspection by the wafer transfer robot 11, the transportation processing is interrupted.

As described above, during intervals of performing macro inspection and micro inspection for the non-inspected semiconductor wafer S, by controlling for the semiconductor wafer S to be transported, it is made possible to simultaneously perform the inspection and the transportation of the semiconductor wafer S in substrate inspection apparatus 81.

Further, when it is possible for three or more wafer cassettes 3 to be mounted on the loader unit 7, the semiconductor wafer S can be classified and housed in the separate wafer cassettes 3 from the one wafer cassette 3 according to the form of the semiconductor wafer S or the presence of defects. Moreover, in this case, the semiconductor wafers S housed in the plurality of wafer cassettes 3 can also be collectively housed in the one wafer cassette 3. In addition, when it is possible for four or more wafer cassettes 3 to be mounted on the loader unit 7, the semiconductor wafer S can be suitably transported from a plurality of wafer cassettes 3 to a plurality of other wafer cassettes 3.

Further, although it is described that one wafer cassette 3 can be mounted on one wafer cassette mounting unit 1a, respectively, it may be constituted so that a plurality of wafer cassettes 3 can be mounted on one wafer cassette mounting unit. When a plurality of wafer cassettes can be mounted on the substrate inspection apparatus, the constitution of the wafer cassette mounting unit can be changed suitably.

Figure 5:
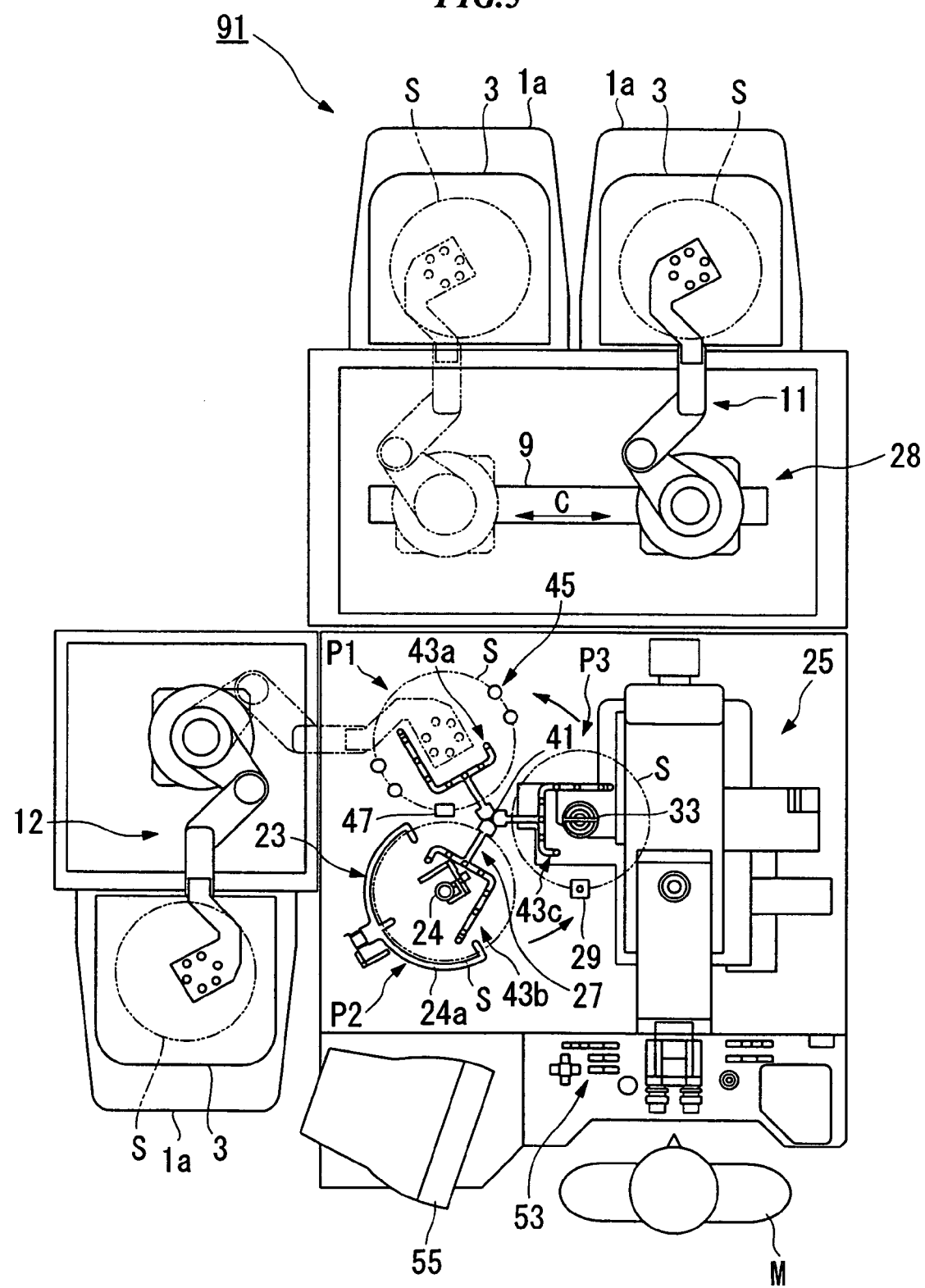
FIG. 5 is an outline plan view showing a substrate inspection apparatus according to still another embodiment of the present invention.

Although the substrate inspection apparatuses 1 and 81 provided with one wafer transfer robot 11 for transporting the semiconductor wafer S from each wafer cassette 3 to the wafer loading position P1 are described, as shown in, for example, FIG. 5, a substrate inspection apparatus 91 having two wafer transfer robots 11 and 12 may be provided. According to the substrate inspection apparatus 91 of this constitution, since respective processings do not mutually interfere even when the inspection processing and the transportation processing of the semiconductor wafer S are simultaneously performed, the inspection processing and the transportation processing can be performed more efficiently.

Further, substrate inspection apparatuses 1, 81, and 91 for performing macro inspection and micro inspection of the semiconductor wafer S are described above. Without limitation to these apparatuses, the present invention can also be applicable to a substrate processing apparatus that suitably performs, at least, processing of the semiconductor wafer S in the processing apparatus main body, such as the macro inspection unit, the micro inspection unit, and the substrate manufacturing apparatus.

Figure 6:
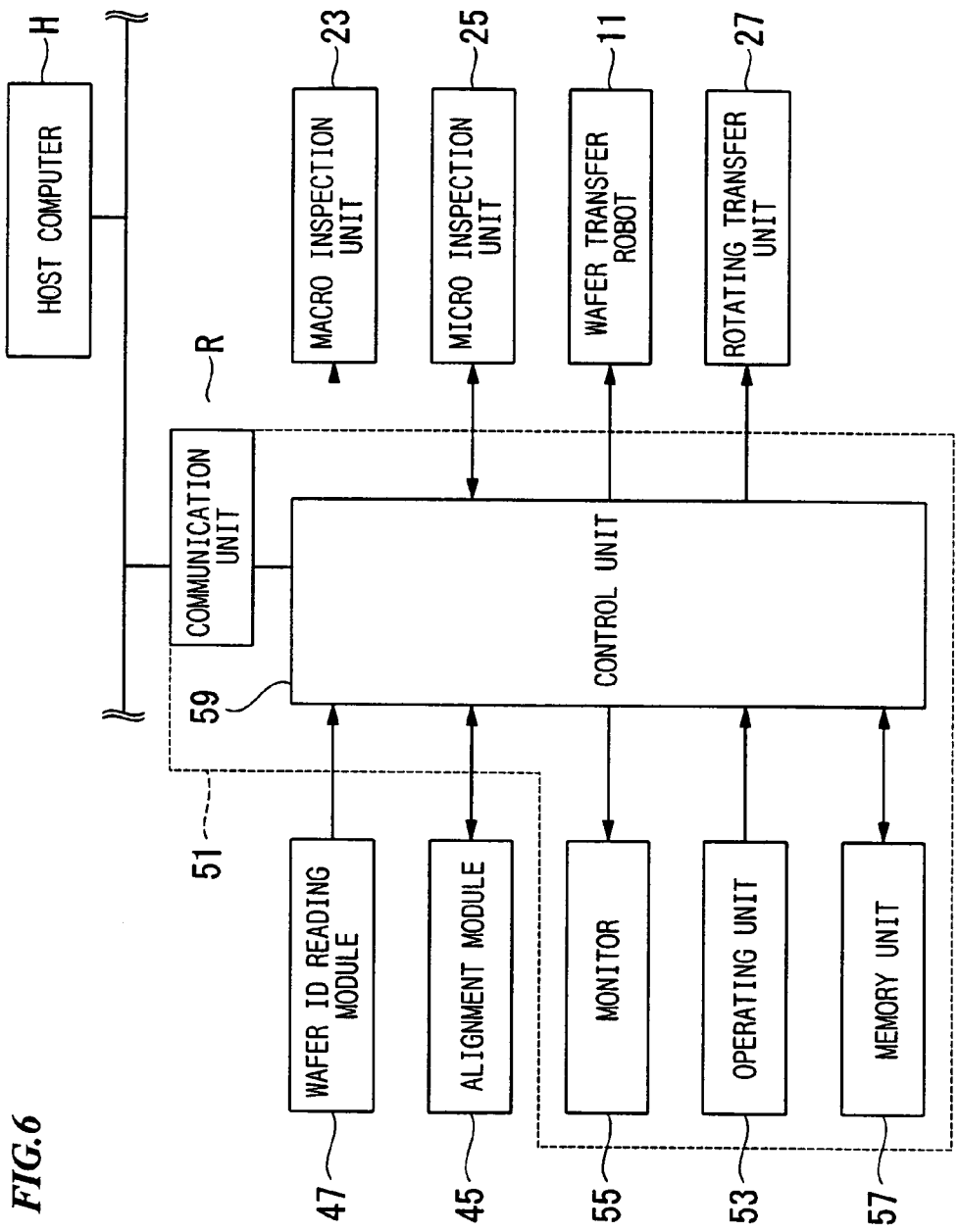
FIG. 6 is a block diagram showing an outline constitution of a substrate processing system provided with the substrate inspection apparatus according to an embodiment of the present invention.

In addition, the present invention, not limited to being applied to a substrate processing apparatus, such as the substrate inspection apparatuses 1, 81 and 91, may be applied to a substrate processing system provided with a plurality of substrate processing apparatuses that are capable of transportation processing in a manner similar to that of the substrate inspection apparatuses 1, 81, and 91, and a host computer that controls these substrate processing apparatuses. An example of the constitution of such a substrate processing system is shown in FIG. 6. According to this constitution, a communication unit R, which can communicate between the control unit 59 of the substrate processing apparatus and a host computer H, is provided in the control unit 51. The system is then constituted such that transportation condition data for transporting the semiconductor wafer S between the wafer cassettes 3 is outputted to the control unit 59 of each substrate processing apparatus from the host computer H. Thereby, the semiconductor wafer S can be transported from one wafer cassette 3 to another wafer cassette 3. Accordingly, in this substrate processing system, in a manner similar to that of substrate inspection apparatuses 1, 81, and 91, a cost reduction in a plant and equipment in the semiconductor manufacturing plant can be achieved. Moreover, the transportation processing in each substrate processing apparatus can be centrally managed by the host computer H.

As mentioned above, a detailed description of the preferred embodiments of the present invention has been given with reference to the drawings, but the present invention is not limited to these embodiments. Without departing from the scope of the present invention, additions, omissions, alternations of the components, and other changes may be possible. The present invention should not necessarily be limited by the above description, but the scope of the present invention is instead defined by the appended claims.

A substrate processing apparatus according to the present invention may be provided with a housing body mounting unit that is capable of mounting a plurality of housing bodies which can house a plurality of substrates; a processing apparatus main body for processing a substrate extracted from the housing body; a transportation unit for transporting the substrate between the housing body and the processing apparatus main body; a processing control unit for controlling the transportation unit and making it transport the substrate between the housing body and the processing apparatus main body; and a transportation control unit for controlling the transportation unit and making it transport the substrate from one housing body to another housing body without passing through the processing apparatus main body.

The housing body mounting unit may mount at least three housing bodies that are capable of delivering the substrate to and from the transporting unit.

The substrate processing apparatus according to the present invention may be provided with a data input unit for inputting transportation conditions for transporting the substrate from one housing body to another housing body, and this data input unit may be electrically connected to the transportation control unit.

In addition, there are, for example, an indication of the housing body of the transporting origin and the housing body of the transporting destination, and a housing condition of the substrate in the housing body of the transporting destination as the transportation conditions to be inputted. Also, as the housing conditions, there are a housing position and a housing direction of the substrate in the housing body of the transporting destination, or the like.

The substrate processing apparatus according to the present invention may be provided with a substrate ID reading unit for reading identification information of the substrate housed in one housing body, and the transportation control unit may transport the substrate from one housing body to another housing body based on the identification information.

The processing apparatus main body may include an inspection unit composed of a macro inspection unit and a micro inspection unit.

The substrate processing apparatus according to the present invention may be provided with a rotating transfer unit for transferring the substrate between the macro inspection unit and the micro inspection unit.

The macro inspection unit may be provided with a mounting table for swinging and rotating the substrate, and an arm for performing macro inspection of a backside of the substrate.

A substrate ID reading unit may be provided at the substrate loading position.

A notch of the substrate may be detected by the substrate ID reading unit provided at the substrate loading position.

When the substrate is transported from one housing body to another housing body without passing through the processing apparatus main body by way of controlling the transportation unit, the substrate may be transported to another housing body after performing alignment at the substrate loading position.

Whether a notch orientation of the substrate is oriented or not is selectable, and if it is oriented, the notch orientation may be specified.

An alignment module for substrate alignment may be provided at the substrate loading position, and the alignment module may include a plurality of position detecting sensors, and a rotation holding unit having a rolling mechanism which mounts and rotates the substrate.

When the substrate is arranged at the substrate loading position, an edge position of the substrate may be detected by the plurality of position detecting sensors, the transportation unit shifted based on this detected result, and thereby a centering deviation of the substrate with respect to the rotation holding unit of the alignment module corrected.

An alignment module for alignment composed of a taper pin that is contacted to the edge of the substrate to find out a center position thereof may be provided at the substrate loading position.

Moreover, a substrate processing system according to the present invention may be provided with a substrate processing apparatus having the constitution mentioned above, and a host computer for outputting to the control unit transportation data of the transportation conditions for transporting the substrate from one housing body to another housing body.

The substrate processing system according to the present invention may be provided with a communication unit that can achieve communication between a control unit of the substrate processing apparatus and the host computer.

According to the substrate processing apparatus and the substrate processing system of the present invention, since the substrate can be transported from one housing body to another housing body, it is not required to separately provide a substrate transportation device, thereby making it possible to achieve cost reduction in a plant and equipment in the plant.

In particular, when three or more housing bodies are mountable, the substrate housed in one housing body can be transported to the processing apparatus body by the transportation unit to be suitably processed, and the substrate housed in two remaining housing bodies can be transported by the transportation unit. Therefore, two operations, namely, substrate transportation between the housing bodies, and suitable processing for the substrate in the processing apparatus main body can be simultaneously performed.

Further, in this case, when transporting the substrate, the substrate can be classified according to the type, size, lot, or the like of the substrate to be housed from one housing body to a separate housing body, and the substrates can also be housed collectively in one housing body from a plurality of housing bodies.

What is claimed is:

1. A substrate processing apparatus, comprising:
   a housing body mounting unit that is capable of mounting at least first and second housing bodies which are adapted to house a plurality of substrates;
   a processing apparatus main body for processing a substrate extracted from one of the first and second housing bodies;
   a transportation unit for transporting the substrate between said one of the first and second housing bodies and the processing apparatus main body;
   a processing control unit for controlling the transportation unit to transport the substrate between said one of the first and second housing bodies and the processing apparatus main body; and
   a transportation control unit for controlling the transportation unit to transport the substrate between the first housing body and the second housing body without passing through the processing apparatus main body.

2. The substrate processing apparatus according to claim 1, wherein the housing body mounting unit is adapted to mount at least three housing bodies from which the substrate is deliverable to and from the transportation unit.

3. The substrate processing apparatus according to claim 1, further comprising
   a data input unit for inputting transportation conditions for transporting the substrate between the first housing body to the second housing body,
   wherein the data input unit is electrically connected to the transportation control unit.

4. The substrate processing apparatus according to claim 1, further comprising
   a substrate ID reading unit for reading identification information of a substrate housed in one of the first and second housing bodies,
   wherein the transportation control unit transports the substrate between the first and second housing bodies based on the identification information.

5. The substrate processing apparatus according to claim 1, wherein the processing apparatus main body includes an inspection unit including a macro inspection unit and a micro inspection unit.

6. The substrate processing apparatus according to claim 5, further comprising a rotating transfer unit for transferring the substrate between the macro inspection unit and the micro inspection unit.

7. The substrate processing apparatus according to claim 5, wherein the macro inspection unit includes a mounting table for swinging and rotating the substrate, and an arm for performing macro inspection of a backside of the substrate.

8. The substrate processing apparatus according to claim 1, wherein the substrate ID reading unit is provided at a substrate loading position.

9. The substrate processing apparatus according to claim 8, wherein a notch of the substrate is detected by the substrate ID reading unit provided at the substrate loading position.

10. The substrate processing apparatus according to claim 1, wherein when the substrate is transported between the first and second housing bodies without passing through the processing apparatus main body, the substrate is transported after performing alignment at a substrate loading position.

11. The substrate processing apparatus according to claim 9, wherein a notch orientation of the substrate is selectable, and if the notch orientation is selected, the notch orientation can be specified.

12. The substrate processing apparatus according to claim 1, further comprising
an alignment module for substrate alignment at a substrate loading position,
wherein the alignment module includes a plurality of position detecting sensors, and a rotation holding unit having a rolling mechanism which mounts and rotates the substrate.

13. The substrate processing apparatus according to claim 12, wherein when the substrate is arranged at the substrate loading position, an edge position of the substrate is detected by the plurality of position detecting sensors, the transportation unit is shifted based on a detected result, and a centering deviation of the substrate with respect to the rotation holding unit of the alignment module is corrected.

14. The substrate processing apparatus according to claim 1, further comprising an alignment module provided at a substrate loading position, wherein said alignment module comprises a taper pin that is adapted to contact an edge of the substrate to find a center position thereof.

15. A substrate processing system, comprising:
a substrate processing apparatus according to claim 1; and
a host computer for outputting to the control unit transportation data of transportation conditions for transporting the substrate between the first and second housing bodies.

16. A substrate processing system, comprising:
a substrate processing apparatus according to claim 1;
a host computer for outputting to the control unit transportation data of transportation conditions for transporting the substrate between the first and second housing bodies; and
a communication unit that communicates between the control unit of the substrate processing apparatus and the host computer.

* * * * *